(12) United States Patent
Dolganov et al.

(10) Patent No.: US 12,375,181 B2
(45) Date of Patent: Jul. 29, 2025

(54) SHUTDOWN CIRCUITRY FOR A LASER EMITTER

(71) Applicant: Lumentum Operations LLC, San Jose, CA (US)

(72) Inventors: Mikhail Dolganov, Gilroy, CA (US); Lijun Zhu, Dublin, CA (US); Hao Huang, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 18/464,591

(22) Filed: Sep. 11, 2023

(65) Prior Publication Data

US 2024/0039637 A1 Feb. 1, 2024

Related U.S. Application Data

(62) Division of application No. 17/449,164, filed on Sep. 28, 2021, now Pat. No. 11,757,533.

(60) Provisional application No. 63/260,261, filed on Aug. 13, 2021.

(51) Int. Cl.
*H04B 10/564* (2013.01)
*H04B 10/50* (2013.01)

(52) U.S. Cl.
CPC ......... *H04B 10/564* (2013.01); *H04B 10/504* (2013.01)

(58) Field of Classification Search
None
See application file for complete search history.

(56) References Cited

U.S. PATENT DOCUMENTS

| | | | |
|---|---|---|---|
| 5,991,040 A | 11/1999 | Doemens et al. | |
| 7,133,610 B1* | 11/2006 | Shimura | H04B 10/50575 |
| | | | 398/198 |
| 2002/0196500 A1 | 12/2002 | Cohen et al. | |
| 2003/0076564 A1 | 4/2003 | Furuichi et al. | |
| 2004/0047635 A1* | 3/2004 | Aronson | H04B 10/40 |
| | | | 398/136 |
| 2004/0114935 A1 | 6/2004 | Fushimi et al. | |
| 2007/0223925 A1 | 9/2007 | Ohtani | |
| 2009/0184662 A1 | 7/2009 | Given et al. | |
| 2012/0106969 A1 | 5/2012 | Ogiwara et al. | |
| 2015/0243155 A1* | 8/2015 | Xiong | G08B 21/182 |
| | | | 398/135 |
| 2015/0381276 A1 | 12/2015 | Saito et al. | |
| 2021/0006034 A1* | 1/2021 | Zamprogno | H03K 17/08142 |

(Continued)

*Primary Examiner* — Darren E Wolf
(74) *Attorney, Agent, or Firm* — Harrity & Harrity, LLP

(57) ABSTRACT

A shutdown circuit may include a filter, for receiving a laser trigger signal for a laser emitter, that is configured to output a filtered signal. The shutdown circuit may include a logic gate configured to receive the filtered signal and at least one of a first signal based on a signal from a photodiode or a second signal based on a signal from a conductive path. The shutdown circuit may include a flip-flop configured to receive an output of the logic gate and to output an enablement signal that is based on the output of the logic gate, and a driver circuit for a switch configured to control current flow to the laser emitter. The driver circuit may be configured to receive the enablement signal and the laser trigger signal and to output the laser trigger signal based on whether the enablement signal is a first or a second voltage.

20 Claims, 5 Drawing Sheets

(56) References Cited

U.S. PATENT DOCUMENTS

2021/0296855 A1* 9/2021 Huang .................... G01S 17/36
2023/0046942 A1 2/2023 Dolganov et al.

* cited by examiner

SHUTDOWN CIRCUITRY FOR A LASER EMITTER

CROSS-REFERENCE TO RELATED APPLICATION

This Patent Application is a division of U.S. patent application Ser. No. 17/449,164, filed Sep. 28, 2021 (now U.S. Pat. No. 11,757,533), which claims priority to U.S. Provisional Patent Application No. 63/260,261, filed on Aug. 13, 2021, and entitled "LASER SHUTDOWN CIRCUIT." The disclosures of the prior Applications are considered part of and are incorporated by reference into this Patent Application.

TECHNICAL FIELD

The present disclosure relates generally to laser emitters and to shutdown circuitry for a laser emitter.

BACKGROUND

Light detection and ranging (LIDAR) systems, such as time-of-flight (ToF)-based measurement systems, emit optical pulses, detect reflected optical pulses, and determine distances to objects by measuring delays between the emitted optical pulses and the reflected optical pulses.

SUMMARY

In some implementations, an optical device includes an optical element; a laser emitter configured to emit light via the optical element; at least one of a photodiode configured to output a first signal based on light emitted by the laser emitter and reflected from the optical element, or a conductive path disposed on the optical element and electrically connected to a shutdown circuit, and configured to output a second signal based on a continuity of the conductive path; and the shutdown circuit, that includes: at least one of a first comparator for comparing the first signal and a first threshold voltage, or a second comparator for comparing the second signal and a second threshold voltage; a filter for receiving a laser trigger signal for the laser emitter, the filter configured to output a filtered signal in which individual pulses of the laser trigger signal are removed; a logic gate configured to receive the filtered signal and an output of at least one of the first comparator or the second comparator; a flip-flop configured to receive an output of the logic gate and to output an enablement signal for the laser emitter that is based on the output of the logic gate; a switch configured to control current flow to the laser emitter based on the laser trigger signal; and a driver circuit for the switch, the driver circuit configured to receive the enablement signal and the laser trigger signal and to output the laser trigger signal based on whether the enablement signal is a first voltage or a second voltage.

In some implementations, a shutdown circuit includes a filter for receiving a laser trigger signal for a laser emitter, the filter configured to output a filtered signal in which individual pulses of the laser trigger signal are removed; a logic gate configured to receive the filtered signal and at least one of a first signal based on a signal from a photodiode or a second signal based on a signal from a conductive path; a flip-flop configured to receive an output of the logic gate and to output an enablement signal for the laser emitter that is based on the output of the logic gate; and a driver circuit for a switch configured to control current flow to the laser emitter, the driver circuit configured to receive the enablement signal and the laser trigger signal and to output the laser trigger signal based on whether the enablement signal is a first voltage or a second voltage.

In some implementations, an optical source includes a laser emitter and a shutdown circuit for the laser emitter that includes: at least one comparator for comparing a signal of a photodiode or a conductive path and a threshold voltage; a filter for receiving a laser trigger signal for the laser emitter, the filter configured to output a filtered signal; a logic gate configured to receive the filtered signal and an output of the least one comparator; a flip-flop configured to receive an output of the logic gate and to output an enablement signal for the laser emitter that is based on the output of the logic gate; a switch configured to control current flow to the laser emitter; and a driver circuit for the switch, the driver circuit configured to receive the enablement signal and the laser trigger signal and to output the laser trigger signal based on whether the enablement signal is a first voltage or a second voltage.

DETAILED DESCRIPTION

The following detailed description of example implementations refers to the accompanying drawings. The same reference numbers in different drawings may identify the same or similar elements.

Light detection and ranging (LIDAR) systems may employ powerful lasers, and thus eye safety is a major concern for LIDAR systems. A LIDAR system may include a laser emitter that emits light via an optical element, such as a diffuser, a protective glass cover, or the like. In some cases, the optical element can become damaged or detached resulting in a laser spot intensity that can be dangerous to the human eye. Thus, a LIDAR system should be equipped with a fast-reacting mechanism that detects an unsafe condition, such as a damaged or detached optical element, and prevents laser light emission.

In some examples, a closed-loop system using a digital controller may be employed for detecting an unsafe condition and preventing laser light emission. For example, the controller of the system may monitor a signal from a photodiode configured to detect light reflected from the optical element of the LIDAR system, and the controller may cause cessation of laser light emission when the signal is indicative of an unsafe condition. However, the controller may be slow to react to the unsafe condition due to the relatively slow response time of software employed by the controller. As a result, laser radiation levels may exceed safety thresholds by the time that the controller commands cessation of laser light emission.

Some implementations described herein relate to a circuit that provides relatively simpler and faster laser emitter shutdown in the event of an unsafe condition. In particular, the shutdown circuit implements a shutdown mechanism at a hardware level, thereby improving the speed and reliability of laser emitter shutdown. The shutdown circuit may prevent current flow to a laser emitter based on a signal from a photodiode, configured to collect light emitted from a laser emitter and reflected from an optical element, and/or a signal from a conductive path electrically connected to the shutdown circuit and configured to conduct current if a continuity of the conductive path is intact. If the optical element is operational (e.g., present and undamaged), the signal of the photodiode, for example, may include pulses that coincide with laser trigger pulse trains. Thus, the shutdown circuit may be configured to detect the absence of one or more pulses of the signal, which is indicative of the optical element becoming detached, damaged, or the like, and prevent current flow to the laser emitter.

Figure 1:
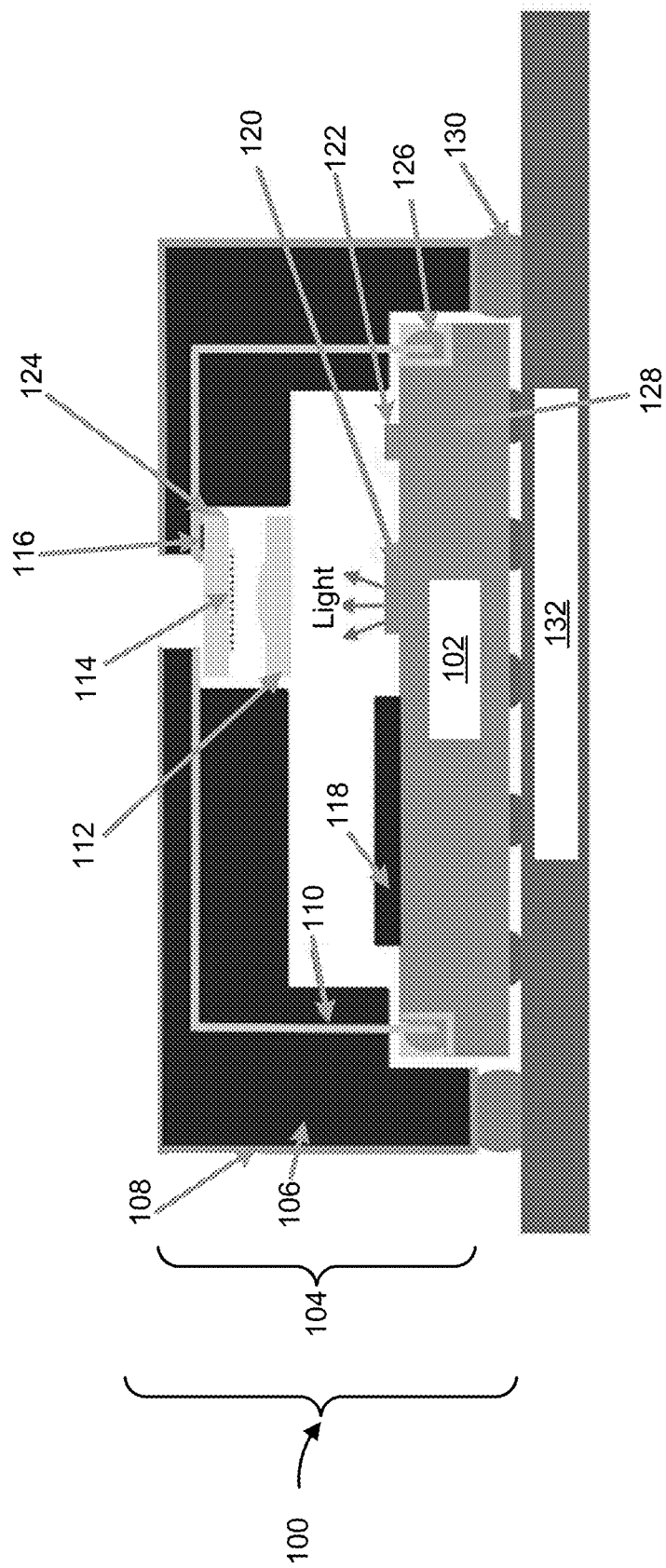
FIG. 1 is a diagram of an example optical device described herein.

FIG. 1 is a diagram of an example optical device 100. The optical device 100 may be, or may be included in, a LIDAR system, such as an in-cabin LIDAR system, an in-cabin indirect time of flight (iTOF) system, or the like.

The optical device 100 may include a substrate 102 (e.g., a printed circuit board) and a housing 104 (e.g., a package housing). The housing 104 may include a dielectric component 106, an electromagnetic interference (EMI) shield 108, and/or one or more conductive traces 110 (e.g., one or more laser direct structuring (LDS) traces).

The dielectric component 106 may include a molded dielectric polymer (e.g., that forms a molded dielectric structural component). As shown in FIG. 1, the EMI shield 108 may be disposed on an exterior surface of the dielectric component 106 (e.g., the EMI shield 108 may be coated, deposited, plated, or formed on a surface of the dielectric component 106 that does not face the substrate 102). The EMI shield 108 may include a metal, such as Cu, Ni, and/or Au, among other examples. As further shown in FIG. 1, a conductive trace 110, of the one or more conductive traces 110, may be disposed within the dielectric component 106 (e.g., the conductive trace 110 may be insert molded into the dielectric component 106) and may include a metal, such as Cu, Ni, and/or Au, among other examples. In some implementations, the housing 104 may include one or more optical elements, such as a lens 112 (e.g., a collimating lens) and/or a diffractive optical element (DOE) or diffuser element 114. In some implementations, the housing 104 may include a conductive path 116 associated with the one or more optical elements (e.g., to facilitate detection of damage to the one or more optical elements, detachment of the one or more optical elements, or the like). The conductive path 116 may include, for example, indium tin oxide (ITO).

In some implementations, an integrated circuit 118 (e.g., a driving circuit), a laser emitter array 120 (e.g., including one or more laser emitters, such as one or more vertical cavity surface emitting lasers (VCSELs)), and/or a photodiode 122 may be disposed on a surface of the substrate 102 (e.g., a top surface of the substrate 102 as shown in FIG. 1). The integrated circuit 118 may provide a driving current to allow the laser emitter array 120 to produce light that emits from the housing 104 via the one or more optical elements (e.g., via the lens 112 and/or the DOE or diffuser element 114). The photodiode 122 may collect light reflected by the one or more optical elements to facilitate determining whether the one or more optical elements are damaged, detached, or the like.

As further shown in FIG. 1, a connecting material 124 may be configured to physically (e.g., structurally) connect the conductive path 116 and/or the one or more optical elements (e.g., the DOE or diffuser element 114) to a conductive trace 110, of the one or more conductive traces 110 (e.g., a surface of the conductive trace 110 that extends from the dielectric component 106). Additionally, or alternatively, the connecting material 124 may be configured to electrically connect the conductive path 116 to the conductive trace 110. For example, the connecting material 124 may include a conductive epoxy (e.g., that includes Ag). In some implementations, a portion of the conductive trace 110 and a portion of the conductive path 116 may contact the connecting material 124.

As further shown in FIG. 1, a connecting material 126 may be configured to physically (e.g., structurally) connect the conductive trace 110 to the substrate 102. Additionally, or alternatively, the connecting material 126 may be configured to electrically connect the conductive trace 110 to the substrate 102. For example, the connecting material 126 may include a conductive epoxy (e.g., that includes Ag). In some implementations, an additional portion of the conductive trace 110 and a portion of the substrate 102 (e.g., shown in FIG. 1 as a "step" cut-out of the substrate 102) may contact the connecting material 126. The portion of the substrate 102 may be plated with a metal (e.g., with Cu, Ni, and/or Au) or an additional conductive trace 128 (e.g., that has a same or similar composition of the conductive trace 110) may be disposed on the portion of the substrate 102 (e.g., the additional conductive trace 128 may be coated, deposited, plated, or formed on the portion of the substrate 102). Accordingly, the conductive trace 110 may be configured to provide an electrical connection between the substrate 102 and the conductive path 116 (e.g., via the additional conductive trace 128, the connecting material 124, and the connecting material 126).

As further shown in FIG. 1, a connecting material 130 may be configured to physically (e.g., structurally) connect the EMI shield 108 (e.g., that is disposed on the dielectric component 106) to a substrate 132 of a user device (e.g., a user device, such as a smart phone, that includes the optical device 100). Additionally, or alternatively, the connecting material 130 may be configured to electrically connect the EMI shield 108 to the substrate 132 of the user device. For example, the connecting material 130 may include a high-viscosity and/or high-conductivity solder (e.g., a solder paste). In some implementations, a portion of the EMI shield 108 (e.g., a surface of the EMI shield 108 that contacts the connecting material 130) may be configured to bond with the connecting material 130 and/or the substrate 132 of the user device. For example, the portion of the EMI shield 108 may be plated with a metal, such as Cu, Ni, and/or Au.

In some implementations, the optical device 100 may include only one of, or both of, the photodiode 122 and the conductive path 116 to facilitate detection of damage to the one or more optical elements, detachment of the one or more optical elements, or the like. For example, the photodiode 122 may be configured to generate a signal based on light emitted by the laser emitter array 120 and reflected from one or more of the optical elements. Thus, if the one or more optical elements are operational (e.g., light is reflected from the one or more optical elements), the signal may be a first voltage, and if the one or more optical elements are not operational (e.g., light is not reflected from the one or more optical elements), the signal may be a second voltage. Similarly, the conductive path 116 may be configured to generate a signal based on a continuity of the conductive path 116. Thus, if the one or more optical elements are operational (e.g., the conductive path 116 is intact), the signal may be a first voltage, and if the one or more optical elements are not operational (e.g., the conductive path 116 is not intact), the signal may be a second voltage.

As indicated above, FIG. 1 is provided as an example. Other examples may differ from what is described with regard to FIG. 1.

Figure 2:
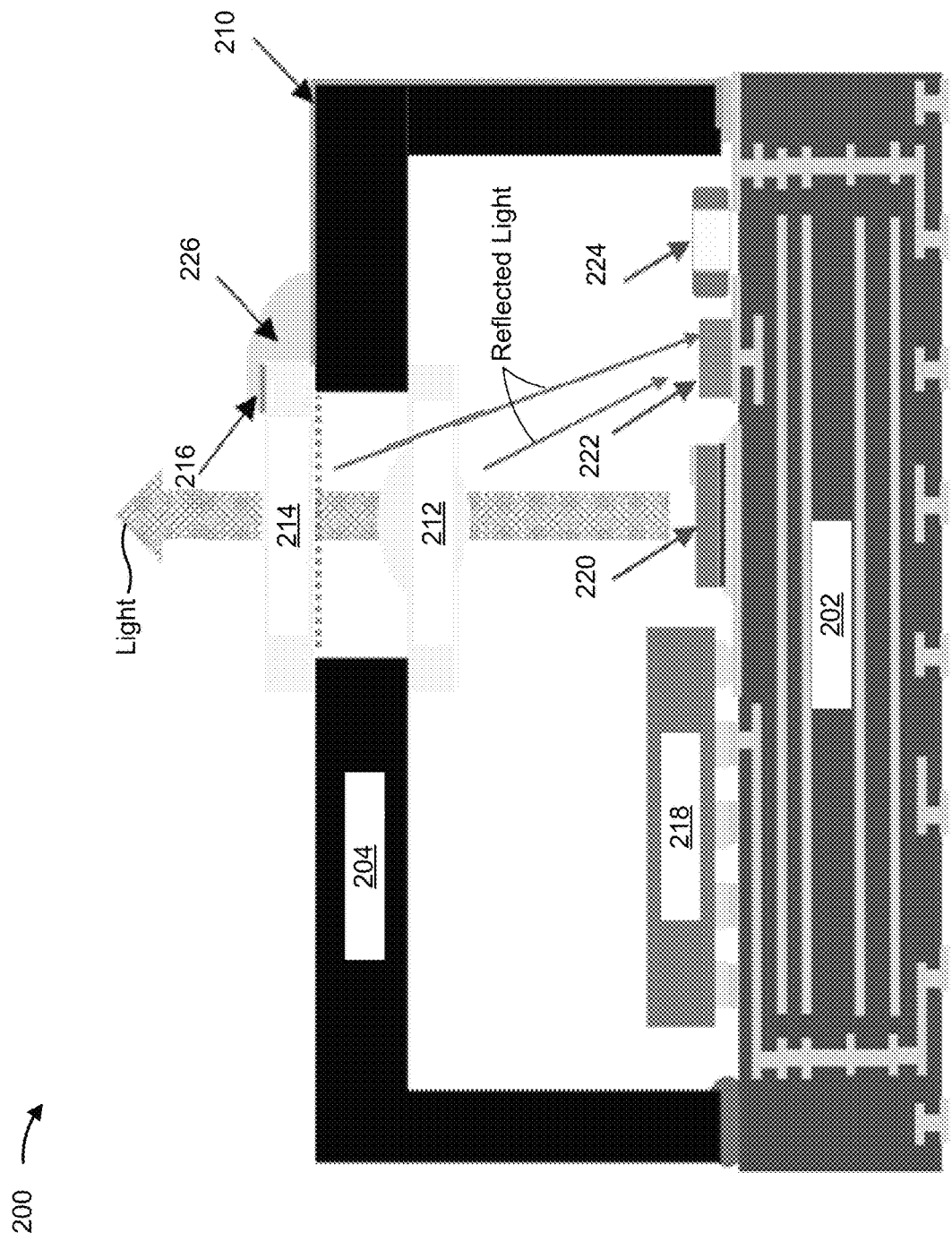
FIG. 2 is a diagram of an example optical device described herein.

FIG. 2 is a diagram of an example optical device 200. The optical device 200 may be, or may be included in, a LIDAR system, such as an in-cabin LIDAR system, an in-cabin iTOF system, or the like.

Components of the optical device 200 may be arranged differently than components of the optical device 100; however, the optical device 200 may operate in a similar manner as the optical device 100, as described above. The optical device 200 may include a substrate 202 (e.g., a printed circuit board) and a housing 204 (e.g., a package housing), in a similar manner as described above. As further shown in FIG. 2, a conductive trace 210, as described above, may be disposed on an exterior of the housing 204.

In some implementations, the housing 204 may include one or more optical elements, such as a lens 212 (e.g., a collimating lens) and/or a DOE or diffuser element 214, in a similar manner as described above. In some implementations, the housing 204 may include a conductive path 216 associated with the one or more optical elements, in a similar manner as described above.

In some implementations, an integrated circuit 218 (e.g., a driving circuit), a laser emitter array 220 (e.g., including one or more laser emitters, such as one or more VCSELs), and/or a photodiode 222 may be disposed on a surface of the substrate 202 (e.g., a top surface of the substrate 202 as shown in FIG. 2), in a similar manner as described above. Additionally, a capacitor 224 may be disposed on the surface of the substrate 202, as shown.

As further shown in FIG. 2, a connecting material 226 may be configured to physically (e.g., structurally) connect the conductive path 216 and/or the one or more optical elements (e.g., the DOE or diffuser element 214) to the conductive trace 210, in a similar manner as described above. Additionally, or alternatively, the connecting material 226 may be configured to electrically connect the conductive path 216 to the conductive trace 210, in a similar manner as described above.

As described above, the optical device 200 may include only one of, or both of, the photodiode 222 and the conductive path 216 to facilitate detection of damage to the one or more optical elements, detachment of the one or more optical elements, or the like. As described above, the photodiode 222 may be configured to generate a signal based on light emitted by the laser emitter array 220 and reflected from one or more of the optical elements, and the conductive path 216 may be configured to generate a signal based on a continuity of the conductive path.

As indicated above, FIG. 2 is provided as an example. Other examples may differ from what is described with regard to FIG. 2.

Figure 3:
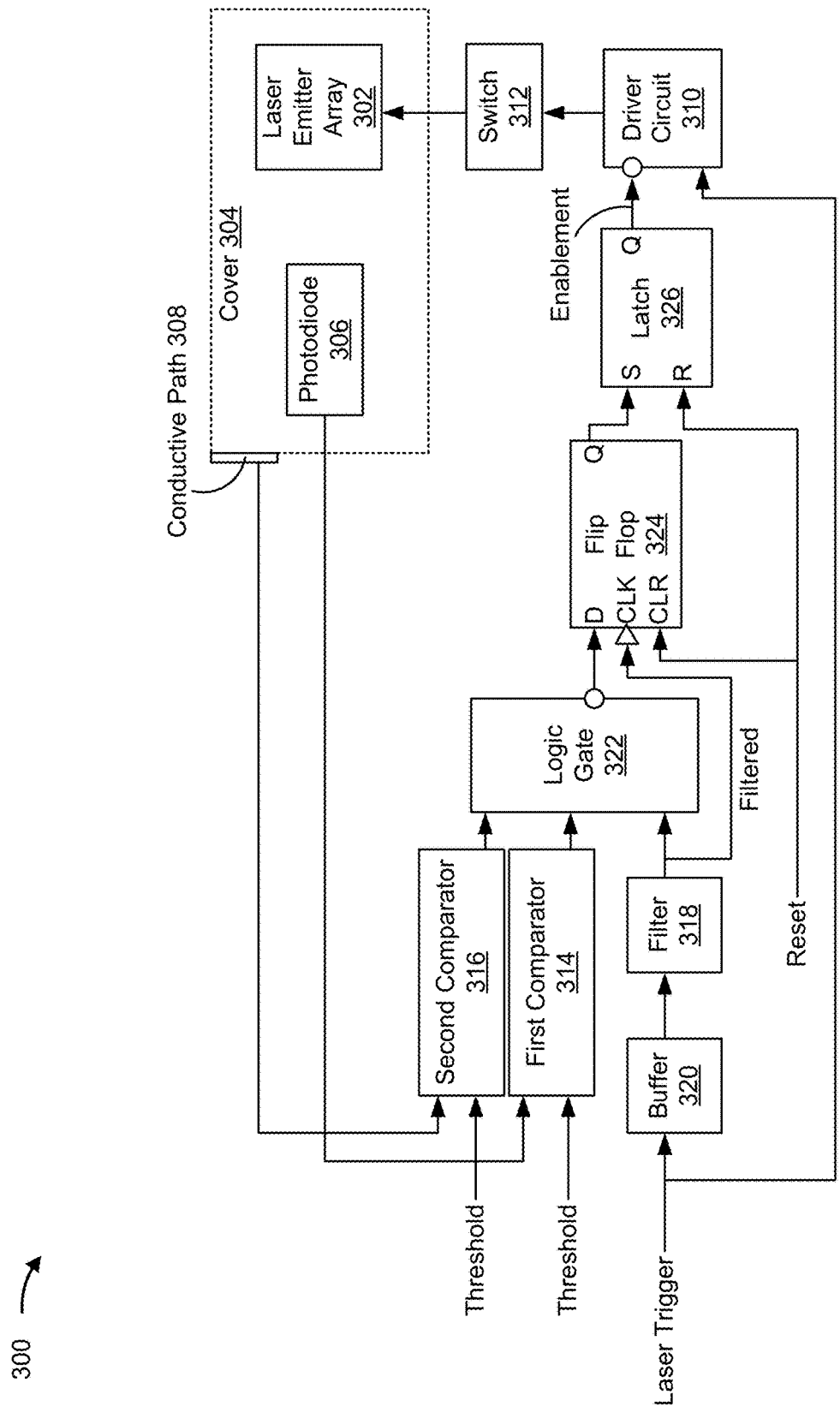
FIG. 3 is a diagram of an example architecture for a shutdown circuit described herein.

FIG. 3 is a diagram of an example architecture for a shutdown circuit 300. The shutdown circuit 300 may be employed in the optical device 100 and/or the optical device 200. In some implementations, the shutdown circuit 300 may be employed in an optical source.

The shutdown circuit 300 may include a laser emitter array 302 (e.g., including one or more laser emitters), which may correspond to the laser emitter array 120 and/or the laser emitter array 220. The shutdown circuit 300 may include an optical element 304, which may correspond to the lens 112, the lens 212, the DOE or diffuser element 114, and/or the DOE or diffuser element 214. In some implementations, the optical element 304 may include a protective cover (e.g., a glass cover) of the optical device. The shutdown circuit 300 may include a photodiode 306, which may correspond to the photodiode 122 and/or the photodiode 222, and/or a conductive path 308, which may correspond to the conductive path 116 and/or the conductive path 216. As described above, the shutdown circuit 300 may include only one of, or both of, the photodiode 306 and the conductive path 308. In some implementations, the shutdown circuit 300 may employ another type of photodetector device.

The shutdown circuit 300 may include a driver circuit 310 and a switch 312. The switch 312 may include a field effect transistor (FET). The switch 312 may have a closed state (e.g., an on state) where, when the switch 312 is in the closed state, current may flow through the switch 312 to the laser emitter array 302. Additionally, the switch 312 may have an open state (e.g., an off state), where, when the switch 312 is in the open state, current may not flow through the switch 312 to the laser emitter array 302.

As shown, the shutdown circuit 300 may receive a laser trigger signal (e.g., from a controller, such as the integrated circuit 118 and/or the integrated circuit 218). The laser trigger signal may be a pulse width modulation (PWM) signal that includes bursts of one or more pulses (e.g., with a 50% modulation frequency), as described below in connection with FIG. 5. The driver circuit 310 may be configured to receive the laser trigger signal at a first input of the driver circuit 310 and to receive an enablement signal, as described below, at a second input of the driver circuit 310. Moreover, the driver circuit 310 may be configured to drive a gate of the switch 312 based on the laser trigger signal. That is, the driver circuit 310 may be configured to output the laser trigger signal to the switch 312 (e.g., based on the enablement signal, as described below). A pulse of the laser trigger signal may cause the switch 312 to transition to the closed state for a duration of the pulse. Between pulses of the laser trigger signal, the switch 312 may be in the open state.

The switch 312 in the closed state may cause current to flow to the laser emitter array 302, thereby producing an optical pulse in which light is emitted from the laser emitter array 302. The photodiode 306 may collect light emitted from the laser emitter array 302 that is reflected from the optical element 304. The photodiode 306 may be configured to output a signal based on light emitted from the laser emitter array 302 and reflected from the optical element 304, as described above. For example, the signal of the photodiode 306 may be a first signal indicative of the optical element 304 being operational (e.g., if light is detected at the photodiode 306) or a second signal indicative of the optical element 304 not being operational (e.g., if light is not detected at the photodiode 306). The conductive path 308 may be electrically connected to the shutdown circuit 300 and disposed on the optical element 304. The conductive path 308 may conduct current based on a continuity of the conductive path 308. The conductive path 308 may be configured to output a signal based on the continuity of the conductive path 308, as described above. For example, the signal from the conductive path 308 may be a first signal indicative of the optical element 304 being operational (e.g., if the continuity of the conductive path 308 is intact) or a second signal indicative of the optical element 304 not being operational (e.g., if the continuity of conductive path 308 is not intact, for example, due to damage or detachment of the optical element 304).

In some implementations, the shutdown circuit 300 may include a first comparator 314 for comparing the signal from the photodiode 306 and a threshold voltage. For example, the first comparator 314 may be configured to receive, at a first input, a signal corresponding to the threshold voltage, and receive, at a second input, the signal from the photodiode 306. The first comparator 314 may output a signal indicating whether the signal from the photodiode 306 (e.g., a voltage of the signal) is greater than the threshold voltage. In some implementations, the threshold voltage (e.g., 0.5 volts (V)) may be between a high voltage signal for the photodiode 306 (e.g., 1 V) and a low voltage signal for the photodiode 306 (e.g., 0 V).

In some implementations, the shutdown circuit 300 may include a second comparator 316 for comparing the signal from the conductive path 308 and a threshold voltage. For example, the second comparator 316 may be configured to receive, at a first input, a signal corresponding to the threshold voltage, and receive, at a second input, the signal from the conductive path 308. The second comparator 316 may output a signal indicating whether the signal from the conductive path 308 (e.g., a voltage of the signal) is greater than the threshold voltage. In some implementations, the threshold voltage may be between a high voltage signal for the conductive path 308 (e.g., if the continuity of the conductive path 308 is not intact) and a low voltage signal for the conductive path 308 (e.g., if the continuity of the conductive path 308 is intact).

The shutdown circuit 300 may include the first comparator 314 if the photodiode 306 is employed in the shutdown circuit 300. Otherwise, the shutdown circuit 300 may omit the first comparator 314. The shutdown circuit 300 may include the second comparator 316 if the conductive path 308 is employed in the shutdown circuit 300. Otherwise, the shutdown circuit 300 may omit the second comparator 316. In other words, the shutdown circuit 300 may include only one of, or both of, the first comparator 314 or the second comparator 316.

The shutdown circuit 300 may include a filter 318. The filter 318 may include a low pass filter. The filter 318 may be configured to receive the laser trigger signal. Moreover, the filter 318 may be configured to output a filtered signal in which individual pulses of the laser trigger signal are removed. In other words, a modulation component (e.g., in a range from 20 megahertz (MHz) to 300 MHz) of the pulse width modulated laser trigger signal may be removed in the filtered signal. For example, the modulation frequency of the laser trigger signal may be removed in the filtered signal to result in the filtered signal having rectangular-shaped pulses.

In some implementations, an envelope (e.g., an outlining of the extremes of a signal) of the filtered signal may correspond in time to an envelope of the signal of the photodiode 306. In other words, a duration from a rising edge to a falling edge of a pulse of the filtered signal may be the same as a duration of a pulse of the signal of the photodiode 306. The signal from the conductive path 308 may be a low voltage if the optical element 304 is operational and a high voltage if the optical element 304 is not operational, and thus, the signal from the conductive path 308 may be inverted (e.g., to result in the high voltage when the optical element 304 is operational, in a similar manner as the signal of the photodiode 306). Additionally, an envelope of the filtered signal may correspond in time to an envelope of the laser trigger signal. In other words, a duration from a rising edge to a falling edge of a pulse of the filtered signal may be the same as a duration from a rising edge of a first pulse, of a burst of pulses of the laser trigger signal, to a falling edge of a last pulse of the burst.

Furthermore, the signal of the photodiode 306 may resemble an envelope of the laser trigger signal. That is, the signal of the photodiode 306 may lack the modulation frequency present in the laser trigger signal due to bandwidth limitations. The filtered signal of the laser trigger signal thus corresponds in time to the signal of the photodiode 306 (e.g., pulses of the filtered signal correspond in time with pulses of the signal of the photodiode 306). In this way, the filtered signal may be used as a clock signal or a gate signal, as described below.

In some implementations, the shutdown circuit 300 includes a buffer element 320 (e.g., a voltage buffer). The buffer element 320 may be configured to receive the laser trigger signal (e.g., prior to the filter 318), and output the laser trigger signal to the filter 318. The buffer element 320 may provide buffering of the laser trigger signal in order to prevent loading or slowing of the laser trigger signal received at the driver circuit 310.

The shutdown circuit 300 may include a logic gate 322. In some implementations, the logic gate 322 may include a logic NAND gate. For example, the logic gate 322 may include a NAND Schmitt trigger gate. However, in some examples, the logic gate 322 may include a logic AND gate. The logic gate 322 may be configured to receive the filtered signal and at least one of a signal based on the signal of the photodiode 306 (e.g., the signal of the first comparator 314 or the signal of the photodiode 306) or a signal based on the signal from the conductive path 308 (e.g., the signal of the second comparator 316 or the signal from the conductive path 308).

The logic gate 322 may have two inputs or three inputs based on whether the shutdown circuit 300 includes only one of, or both of, the photodiode 306 and the conductive path 308 (e.g., whether the shutdown circuit 300 includes only one of, or both of, the first comparator 314 and the second comparator 316). For example, the logic gate 322 (e.g., with two inputs) may be configured to receive the filtered signal at a first input and the signal of the first comparator 314 (if present) or the signal of the second comparator 316 (if present) at a second input. As another example, the logic gate 322 (e.g., with three inputs) may be configured to receive the filtered signal at a first input, the signal of the first comparator 314 at a second input, and the signal of second comparator 316 at a third input. Input of the filtered signal (e.g., which includes pulses that correspond in time to bursts of pulses of the laser trigger signal) to the logic gate 322 enables the shutdown circuit 300 to detect when the signal of the photodiode 306 and/or the signal from the conductive path 308 is indicative of the optical element 304 being non-operational during a burst of pulses of the laser trigger signal (e.g., when light emission is occurring).

An output of the logic gate 322 may be input to a bistable circuit (e.g., a latch, a flip-flop, or the like). For example, as shown, the output of the logic gate 322 may be input to a flip-flop 324. The flip-flop 324 may include a D-type flip-flop. The flip-flop 324 may be configured to receive a signal output from the logic gate 322 at a data input of the flip-flop 324. Additionally, the flip-flop 324 may be configured to receive the filtered signal (e.g., which includes pulses that correspond in time to bursts of pulses of the laser trigger signal) at a clock input of the flip-flop 324 (e.g., a clock signal for the flip-flop 324 may be the filtered signal). In this way, the flip-flop 324 may have an opportunity to latch to different states during each burst of pulses of the laser trigger signal. In some implementations, the flip-flop 324 may be configured to receive a reset signal at a reset input of the flip-flop 324. The reset signal may set the flip-flop 324 to a particular known state, for example, upon powering on of an optical device that includes the shutdown circuit 300.

The flip-flop 324 may be configured to output an enablement signal for the laser emitter array 302 that is based on the output of the logic gate 322. The enablement signal may be a first voltage or a second voltage. The enablement signal may be the first voltage (e.g., during a burst of the laser trigger signal) if the signal of the photodiode 306 (if present) and the signal from the conductive path 308 (if present) are based on the optical element 304 being operational (e.g., the optical element 304 is attached and undamaged). For example, the signal output from the logic gate 322, upon which the enablement signal is based, may be a first signal (e.g., a low voltage signal) if the signal of the photodiode 306 (if present) and the signal from the conductive path 308 (if present) are based on the optical element being operational. The enablement signal may be the second voltage (e.g., during a burst of the laser trigger signal) if at least one of the signal of the photodiode 306 (if present) or the signal from the conductive path 308 (if present) is based on the optical element not being operational (e.g., the optical element 304 is detached or damaged). For example, the signal output from the logic gate 322, upon which the enablement signal is based, may be a second signal (e.g., a high voltage signal) if at least one of the signal of the photodiode 306 (if present) or the signal from the conductive path 308 (if present) is based on the optical element not being operational.

In some implementations, an output of the flip-flop 324 may be input to another bistable circuit (e.g., a latch, a flip-flop, or the like). For example, as shown, the output (e.g., the non-inverted output) of the flip-flop 324 may be input to a latch 326. The latch 326 may include a set-reset (SR) latch. The latch 326 may be configured to receive the enablement signal output from the flip-flop 324 at a set input of the latch 326. Additionally, the latch 326 may be configured to output the enablement signal to the driver circuit 310. In other words, upon receiving the enablement signal from the flip-flop 324, an output of the latch 326 may latch to the enablement signal (e.g., if the enablement signal is high, then the latch 326 may latch to a high state). In some implementations, the shutdown circuit 300 may omit the latch 326. Here, the enablement signal of the flip-flop 324 may be output to the driver circuit 310.

In some implementations, the latch 326 may be configured to receive a reset signal at a reset input of the latch 326. The reset signal may set the latch 326 to a particular known state (e.g., upon powering on of an optical device that includes the shutdown circuit 300, after repair of the optical device (e.g., to fix or replace the optical element 304), after a determination (e.g., by the optical device or a technician) that the optical element 304 is operational, or the like). In this way, the latch 326 may prevent current flow to the laser emitter array 302 (e.g., until the latch 326 is reset) in a scenario in which the signal of the photodiode 306 and/or the signal from the conductive path 308 is intermittent due to partial detachment of the optical element 304 (e.g., the optical element 304 is flipping around) and/or due to light emitted from the laser emitter array 302 being reflected by an external nearby object (e.g., a human body).

As described above, the driver circuit 310 may be configured to receive the laser trigger signal at a first input of the driver circuit 310 and to receive the enablement signal (e.g., from the flip-flop 324 or from the latch 326) at a second input of the driver circuit 310. Moreover, the driver circuit 310 may be configured to output the laser trigger signal to the switch 312 based on the enablement signal. That is, the driver circuit 310 may be configured to output the laser trigger signal to the switch 312 based on whether the enablement signal is the first voltage or the second voltage. For example, the driver circuit 310 may be configured to output the laser trigger signal to the switch 312 if the enablement signal is the first voltage. Similarly, the driver circuit 310 may be configured to refrain from outputting the laser trigger signal to the switch 312 if the enablement signal is the second voltage.

As described above, if the laser trigger signal is received at the switch 312 (e.g., because the enablement signal is the first voltage), the laser trigger signal (e.g., pulses of the laser trigger signal) may cause closing of the switch 312, thereby allowing current to flow to the laser emitter array 302 to produce optical pulses. Similarly, if the laser trigger signal is not received at the switch 312 (e.g., because the enablement signal is the second voltage), the switch 312 may remain open. In other words, the enablement signal being the second voltage may prevent the switch from transitioning from an open state to a closed state, thereby preventing the laser emitter array 302 from producing optical pulses.

As indicated above, FIG. 3 is provided as an example. Other examples may differ from what is described with regard to FIG. 3.

Figure 4:
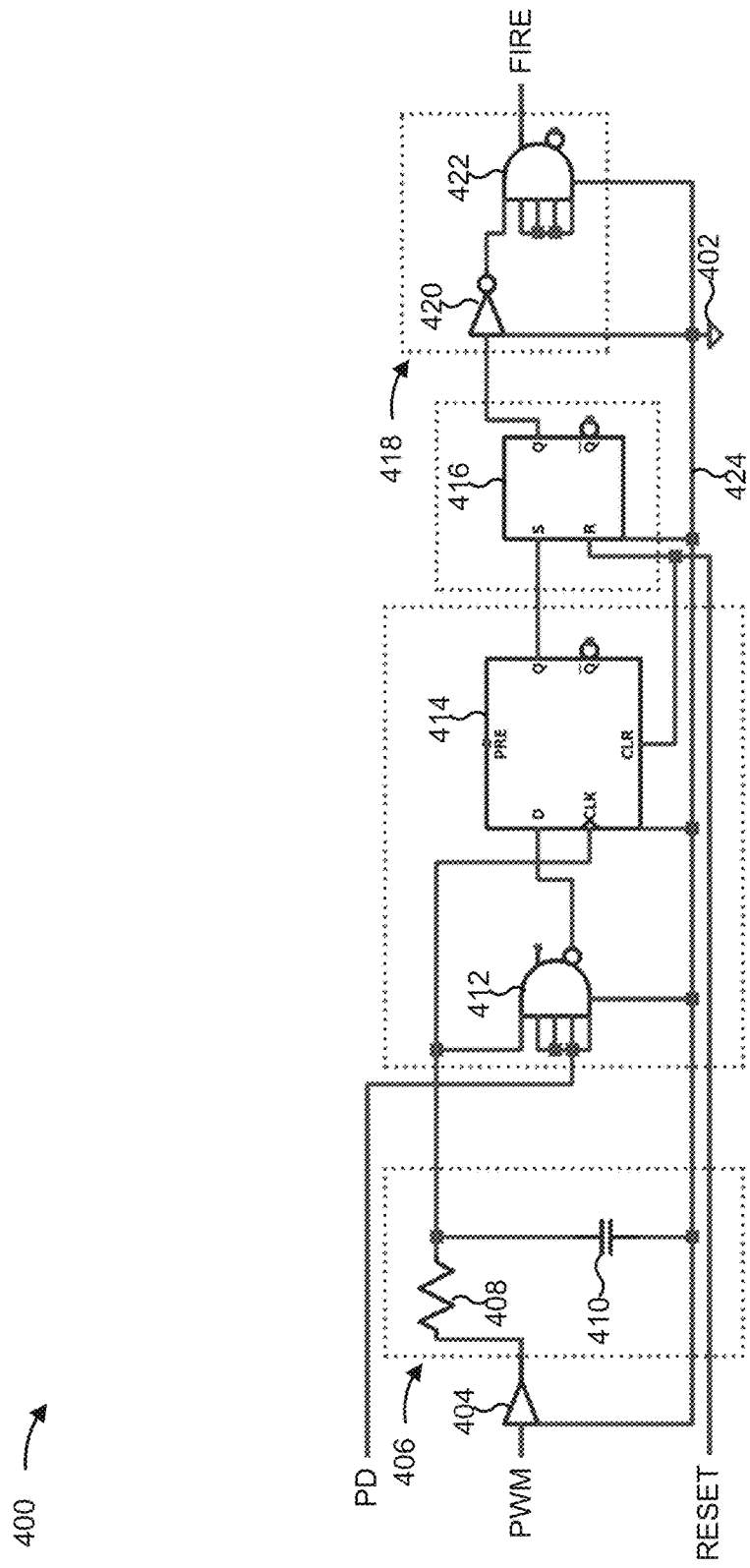
FIG. 4 is a diagram of an example shutdown circuit described herein.

FIG. 4 is a diagram of an example shutdown circuit 400. The shutdown circuit 400 may embody the architecture of the shutdown circuit 300; however, other embodiments of the architecture of the shutdown circuit 300 are possible. Accordingly, the shutdown circuit 400 may be included in an optical device, such as the optical device 100 and/or the optical device 200. In some implementations, the shutdown circuit 400 may be employed in an optical source.

The shutdown circuit 400 may include a source (not shown) and a ground 402. The source may provide an electrical input of the shutdown circuit 400. For example, the source may provide current to the shutdown circuit 400. The source may be a direct current (DC) voltage source, a DC current source with a resistive load, or the like.

As shown, the shutdown circuit 400 may include a buffer element 404, configured to receive a laser trigger signal (shown as PWM), and a filter 406, configured to output a filtered signal based on the laser trigger signal, in a similar manner as described above. The filter 406, shown as a low pass filter, may include a resistive element 408 (e.g., a resistor) and a capacitive element 410 (e.g., a capacitor). As further shown, the shutdown circuit 400 may include a logic gate 412 configured to receive the filtered signal and a signal (shown as PD) from a photodiode and/or a conductive path, in a similar manner as described above. As further shown, the shutdown circuit 400 may include a flip-flop 414 configured to receive a signal output from the logic gate 412 and the filtered signal as a clock signal, and to output an enablement signal, in a similar manner as described above.

In some implementations, the shutdown circuit 400 may include a latch 416 configured to receive the enablement signal. As further shown, the shutdown circuit 400 may include a driver circuit 418 configured to receive the enablement signal and the laser trigger signal (unfiltered), in a similar manner as described above. The driver circuit 418 may be configured to output the laser trigger signal (shown as FIRE) based on the enablement signal, in a similar manner as described above. The driver circuit 418 may include an inverter 420 and/or a logic gate 422 (e.g., a logic NAND gate). The components of the shutdown circuit 400 may be interconnected by current-carrying conductors 424 (e.g., traces, wires, or the like), as shown.

As indicated above, FIG. 4 is provided as an example. Other examples may differ from what is described with regard to FIG. 4.

Figure 5:
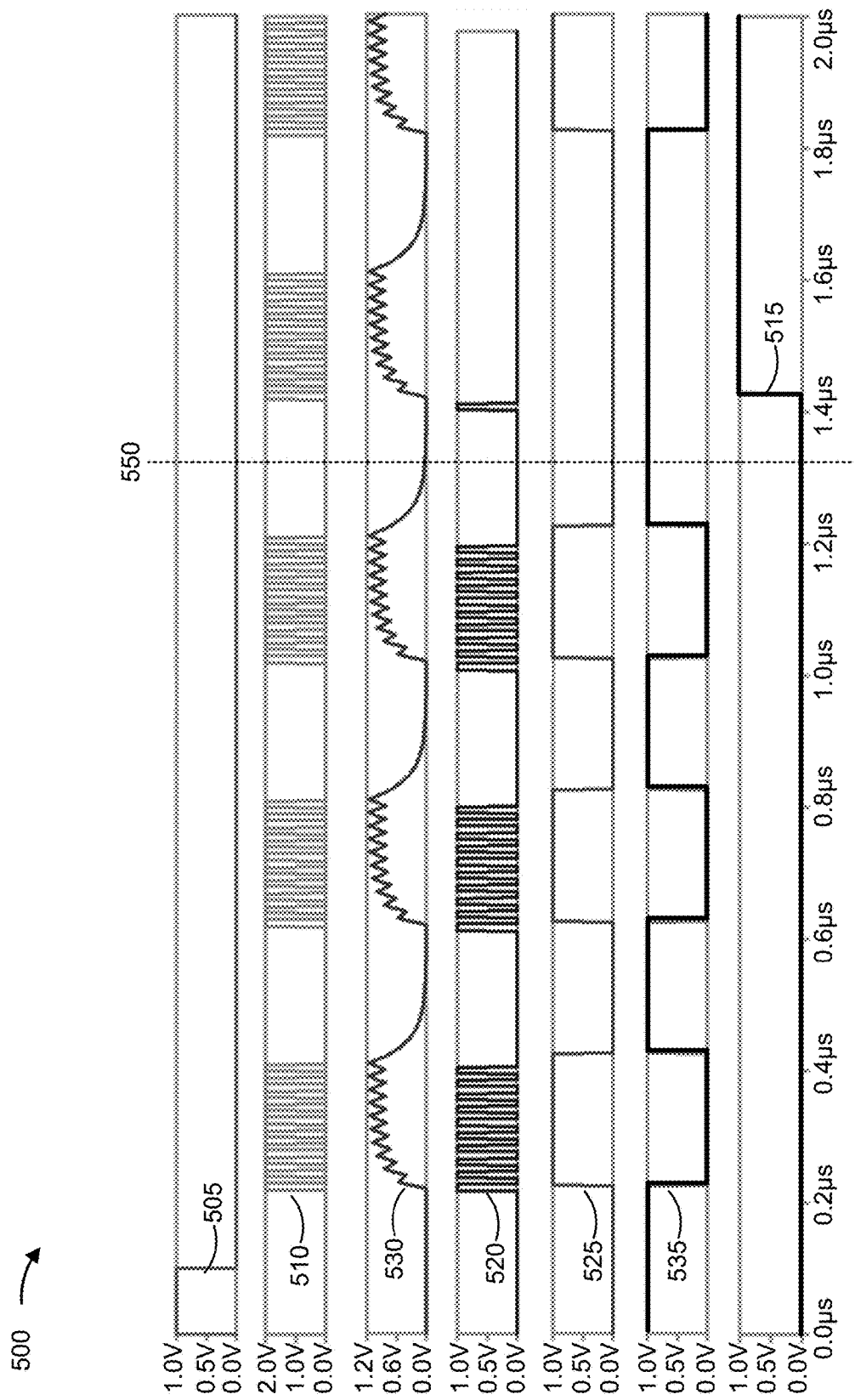
FIG. 5 is a diagram of example graphs plotting electrical signals associated with an example shutdown circuit described herein.

FIG. 5 is a diagram of example graphs 500 plotting electrical signals associated with an example shutdown circuit described herein. For example, the electrical signals of the graphs 500 may be associated with the shutdown circuit 300 or the shutdown circuit 400, described above. The description of the graphs 500 below is with reference to the shutdown circuit 300.

Line 505 shows a reset signal. A pulse of the reset signal may reset the flip-flop 324 and/or the latch 326, as described above. Line 510 shows a laser trigger signal that includes bursts of pulses. As described above, the laser trigger signal (e.g., which may be provided by a controller) may be input to the driver circuit 310 with an enablement signal shown by line 515. When the enablement signal is a first voltage (e.g., a low voltage, shown prior to vertical line 550), the driver circuit 310 outputs the laser trigger signal, shown by line 520, to control the switch 312, thereby generating optical pulses at the laser emitter array 302. Light emitted by the laser emitter array 302 may be reflected from the optical element 304 and collected at the photodiode 306, resulting in the photodiode 306 generating a signal shown by line 525 (e.g., the portion of line 525 prior to line 550). The first comparator 314 may be used, as described above, to generate the rectangular pulse shape for the signal of the photodiode 306 shown by line 525. As shown, an envelope of a pulse of the signal of the photodiode 306 (line 525) corresponds in time to an envelope of a burst of pulses of the laser trigger signal (line 510 or line 520).

As described above, the laser trigger signal also may be input to the filter 318 (e.g., via the buffer element 320). Line 530 shows the filtered signal that is output by the filter 318. As shown, an envelope of a pulse of the filtered signal (line 530) corresponds in time to an envelope of a burst of pulses of the laser trigger signal (line 510 or line 520) and an envelope of a pulse of the signal of the photodiode 306 (line 525). The filtered signal (line 530) and the signal of the photodiode (line 525) may be input to the logic gate 322, as described above. A signal output from the logic gate 322 is shown by line 535. As described above, the flip-flop 324 may receive the signal output from the logic gate 322 (line 535) and output the enablement signal (line 515). For example, the flip-flop 324 may output the enablement signal to the latch 326 or to the driver circuit 310.

At vertical line 550, an event affecting the operation of the optical element 304 occurs. For example, the optical element 304 may become detached or broken at line 550. As a result, one or more pulses of the signal of the photodiode 306 (line 525) may be absent, thereby resulting in the signal output from the logic gate 322 (line 535) changing (e.g., remaining at a high voltage). This in turn results in the enablement signal (line 515) changing from the first voltage to a second voltage (e.g., a high voltage). For example, when the signal of the photodiode 306 is a low voltage, the non-inverted output of the flip-flop 324 latches to a high state (e.g., the enablement signal is the second voltage). When the enablement signal is the second voltage (e.g., after line 550), the driver circuit 310 does not output the laser trigger signal, thereby inhibiting closing of the switch 312 and preventing optical pulses at the laser emitter array 302. As shown by line 520 (e.g., after line 550), a single pulse to the laser emitter array 302 may occur before the enablement signal shuts down the laser emitter array 302. If the latch 326 is employed, as described above, once the enablement signal becomes the second voltage, the latch 326 may continue to output the enablement signal at the second voltage, thereby preventing optical pulses at the laser emitter array 302 until the latch 326 is reset.

As indicated above, FIG. 5 is provided as an example. Other examples may differ from what is described with regard to FIG. 5.

In some implementations, the shutdown circuit 300 or a portion thereof and/or the shutdown circuit 400 or a portion thereof may be included in a ToF-based (e.g., direct ToF or indirect ToF) measurement system. For example, the ToF-based measurement system may include a LIDAR system. According to some implementations, a method may include generating an optical pulse for ToF-based measurement using the shutdown circuit 300 or a portion thereof and/or the shutdown circuit 400 or a portion thereof; and/or detecting an object based on the optical pulse. The method may further include preventing a subsequent optical pulse using the shutdown circuit 300 or a portion thereof and/or the shutdown circuit 400 or a portion thereof. According to some implementations, a method may include generating (or forming) an array of light spots for three-dimensional sensing using the shutdown circuit 300 or a portion thereof and/or the shutdown circuit 400 or a portion thereof. The method may further include preventing subsequent generation of the array of light spots using the shutdown circuit 300 or a portion thereof and/or the shutdown circuit 400 or a portion thereof. According to some implementations, a method may include generating (or forming) a light pattern for three-dimensional sensing using the shutdown circuit 300 or a portion thereof and/or the shutdown circuit 400 or a portion thereof. The method may further include preventing subsequent generation of the light pattern using the shutdown circuit 300 or a portion thereof and/or the shutdown circuit 400 or a portion thereof.

The laser emitter array of implementations described herein may be an array of one or more VCSELs, an array of one or more edge-emitting lasers, an array of one or more of another type of light emitter, or a combination of any one or more of the foregoing. While the description above is in terms of LIDAR, implementations described herein are equally applicable to laser shutdown for other applications.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A shutdown circuit, comprising:
    a filter for receiving a laser trigger signal for a laser emitter, the filter configured to output a filtered signal in which individual pulses of the laser trigger signal are removed;
    a logic gate configured to receive the filtered signal and at least one of:
        a first signal based on a signal from a photodiode, or
        a second signal based on a signal from a conductive path;
    a flip-flop configured to receive an output of the logic gate and to output an enablement signal for the laser emitter that is based on the output of the logic gate; and
    a driver circuit for a switch configured to control current flow to the laser emitter, the driver circuit configured to receive the enablement signal and the laser trigger signal and to output the laser trigger signal based on whether the enablement signal is a first voltage or a second voltage.

2. The shutdown circuit of claim 1, further comprising:
    a buffer element configured to receive the laser trigger signal and to output the laser trigger signal to the filter.

3. The shutdown circuit of claim 1, further comprising:
    a latch configured to receive the enablement signal from the flip-flop and to output the enablement signal to the driver circuit.

4. The shutdown circuit of claim 1, further comprising the switch.

5. The shutdown circuit of claim 1, wherein the filter is a low pass filter.

6. The shutdown circuit of claim 1, wherein the logic gate is a logic NAND gate.

7. The shutdown circuit of claim 1, wherein the flip-flop is a D-type flip-flop.

8. The shutdown circuit of claim 1, wherein an envelope of a pulse of the filtered signal corresponds in time to an envelope of a burst of pulses of the laser trigger signal.

9. A shutdown circuit, comprising:
    at least one of:
        a first comparator for comparing a first signal and a first threshold voltage, or
        a second comparator for comparing a second signal and a second threshold voltage;
    a filter for receiving a laser trigger signal for a laser emitter, the filter configured to output a filtered signal in which individual pulses of the laser trigger signal are removed;
    a logic gate configured to receive the filtered signal and an output of at least one of the first comparator or the second comparator;
    a flip-flop configured to receive an output of the logic gate and to output an enablement signal for the laser emitter that is based on the output of the logic gate;
    a switch configured to control current flow to the laser emitter based on the laser trigger signal; and
    a driver circuit for the switch, the driver circuit configured to receive the enablement signal and the laser trigger signal and to output the laser trigger signal based on whether the enablement signal is a first voltage or a second voltage.

10. The shutdown circuit of claim 9, wherein the enablement signal is the first voltage if both the first signal and the second signal are based on an optical element being operational, and
    wherein the enablement signal is the second voltage if at least one of the first signal or the second signal is based on the optical element not being operational.

11. The shutdown circuit of claim 9, wherein the enablement signal being the second voltage is to prevent the switch from transitioning from an open state to a closed state.

12. The shutdown circuit of claim 9, wherein the shutdown circuit further comprises:
    a latch configured to receive the enablement signal from the flip-flop and to output the enablement signal to the driver circuit.

13. The shutdown circuit of claim 9, wherein a clock signal for the flip-flop is the filtered signal.

14. The shutdown circuit of claim 9, wherein an envelope of the filtered signal corresponds in time to an envelope of the first signal.

15. A shutdown circuit, comprising:
    at least one comparator for comparing a signal of a photodiode or a conductive path and a threshold voltage;
    a filter for receiving a laser trigger signal for a laser emitter, the filter configured to output a filtered signal;
    a logic gate configured to receive the filtered signal and an output of the at least one comparator;
    a flip-flop configured to receive an output of the logic gate and to output an enablement signal for the laser emitter that is based on the output of the logic gate;
    a switch configured to control current flow to the laser emitter; and
    a driver circuit for the switch, the driver circuit configured to receive the enablement signal and the laser trigger signal and to output the laser trigger signal based on whether the enablement signal is a first voltage or a second voltage.

16. The shutdown circuit of claim 15, further comprising:
    a buffer element configured to receive the laser trigger signal and to output the laser trigger signal to the filter.

17. The shutdown circuit of claim 15, wherein the shutdown circuit further comprises:
    a latch configured to receive the enablement signal from the flip-flop and to output the enablement signal to the driver circuit.

18. The shutdown circuit of claim 15, wherein the signal of the photodiode or the conductive path is a first signal indicative of an optical element for the laser emitter being operational or a second signal indicative of the optical element not being operational.

19. The shutdown circuit of claim 15, wherein a clock signal for the flip-flop is the filtered signal.

20. The shutdown circuit of claim 15, wherein an envelope of the filtered signal corresponds in time to an envelope of the laser trigger signal.

* * * * *